United States Patent [19]

Ishikawa et al.

[11] Patent Number: 4,793,862

[45] Date of Patent: Dec. 27, 1988

[54] SILICA-BASED ANTIMONY CONTAINING FILM-FORMING COMPOSITION

[75] Inventors: Tsutomu Ishikawa, Kanagawa; Muneo Nakayama, Tokyo; Akira Hashimoto; Toshihiro Nishimura, both of Kanagawa, all of Japan

[73] Assignee: Tokyo Ohka Kogyo Co., Ltd., Kanagawa, Japan

[21] Appl. No.: 92,510

[22] Filed: Sep. 3, 1987

[30] Foreign Application Priority Data

Sep. 8, 1986 [JP] Japan ................................ 61-209568

[51] Int. Cl.$^4$ ................................................. C09K 3/00
[52] U.S. Cl. ............................. 106/287.13; 106/287.16
[58] Field of Search ............... 556/10, 64; 106/287.16, 106/287.13; 328/29

[56] References Cited

U.S. PATENT DOCUMENTS 2,687,399  8/1954  Noll et al. ............................. 528/29
3,915,766  10/1975  Pollack et al. .................. 106/287.16
4,361,691  11/1982  Yajima et al. ......................... 556/10

Primary Examiner—Theodore Morris
Attorney, Agent, or Firm—Pennie & Edmonds

[57] ABSTRACT

An improved silica-based film-forming composition for diffusion of antimony in the doping works of semiconductors is proposed which comprises an organic solvent, a partial hydrolysis product of an alkoxy silane compound and an antimony compound dissolved in the organic solvent. The antimony compound in the inventive composition is an alkoxy antimony or aryloxy antimony compound so that the problem of corrosion of the coating apparatus can be entirely avoided without decreasing the dopant concentration in the semiconductor substrate, as well as to provide a film-forming composition which is advantageously stable in storage.

32 Claims, No Drawings

SILICA-BASED ANTIMONY CONTAINING FILM-FORMING COMPOSITION

TECHNICAL FIELD

The present invention relates to a silica-based film-forming composition for diffusion of antimony compounds used in the manufacturing process of semiconductor integrated circuit devices.

BACKGROUND OF THE INVENTION

As is well known, the manufacture of semiconductor devices utilizing integrated circuits involves a diffusion step wherein various kinds of dopants form doped areas having p type or n type electroconductivity. In practicing this diffusion step, certain methods have been used, including gas-diffusion, solid-diffusion, ion implantation and coating diffusion. The coating diffusion method is carried out by coating the substrate's surface with a dopant source in a liquid form followed by calcination so as to form the desired doped areas. Despite the simplicity of the procedure, this method provides a doped area having a relatively high dopant concentration. The diffusion coating technique has thus been widely used in recent years.

In the manufacture of bipolar integrated circuit devices, the series resistance of the collector can be decreased by forming a buried collector layer within the semiconductor substrate. The epitaxial layer is thereafter formed on this semiconductor substrate. Arsenic and antimony are dopants which can be used to obtain diffusion into the semiconductor substrate to form a buried collector layer. Antimony is preferred to arsenic, however, antimony diffuses to a lesser degree from the buried layer to the epitaxial layer.

The most widely used coating liquid for the diffusion coating of antimony compounds is a silica-based, film-forming liquid coating containing antimony trichloride ($SbCl_3$). The liquid coating is prepared by dissolving, in an organic solvent, a silanol compound represented by the general formula $R_{r-n}Si(OH)_n$, in which R is a hydrogen atom, an alkyl group, an aryl group or an acyloxy group and n is a positive integer not exceeding 4; and a chlorinated antimony compound such as $SbCl_3$, $SbOCl$, $Sb_4O_5Cl$ and the like. Although these chlorinated antimony compounds are advantageous due to the relatively high concentration of the dopant which they supply when used as the dopant source, one of the serious problems in the use of such compounds is the corrosion of the apparatus (such as spin coaters) used for coating the substrate surface which results due to the chlorine atoms contained therein.

In this regard, a proposal has been made to use, as a dopant source of antimony, a coating liquid prepared by dissolving antimony sesquioxide ($Sb_2O_3$) in an organic solvent. This method is, however, not quite as efficient as the diffusion coating method of antimony because antimony sesquioxide has a melting point and boiling point at 656° C. and 1425° C., respectively, while the diffusion process is usually performed at a temperature in the range from 1200° to 1300° C. Furthermore, the practical applicability of these coating liquids for diffusion of antimony is limited due to their poor storage stability. Therefore, it has been a long-sought goal of the semiconductor industry to develop an improved silica-based film-forming composition for diffusion of antimony free from the above described problems and disadvantages of the prior art compositions.

SUMMARY OF THE INVENTION

Accordingly, the silica-based film-forming composition of the present invention, for the diffusion of antimony, which has been developed as a result of extensive experimentation, comprises:

(a) an organic solvent;
(b) a partial hydrolysis product of an alkoxy silane compound dissolved in the organic solvent; and
(c) an antimony compound selected from the group consisting of alkoxy antimonies and aryloxy antimonies dissolved in the organic solvent.

Specifically advantageous proportions, components and combinations are illustrated in the detailed description which follows.

DETAILED DESCRIPTION OF THE INVENTION

As will be understood from the above summary of the invention, the principal ingredients in the silica-based film-forming composition of the invention for the diffusion of antimony are a partial hydrolysis product of an alkoxy silane compound and a specific antimony compound dissolved in an organic solvent. In the following, detailed descriptions are provided of each of the components in the present composition.

The alkoxy silane compound, of which a partial hydrolysis product is preferred, forms one of the ingredients of the inventive composition and is represented by the general formula:

$$(R^1O)_{4-n}SiR^2_n \qquad (I)$$

in which $R^1$ and $R^2$, each independently from the other, can be an alkyl, alkoxy, alkenyl, aryl, glycidyloxy alkyl, acryloxy alkyl, or methacryloxy alkyl group and n is zero or a positive integer selected from 1, 2 or 3.

Specific examples of the alkoxy silane compounds conforming conformity with the general formula (I) and suitable for use in the present invention are tetramethoxy silane; tetraethoxy silane; tetrapropoxy silane; tetrabutoxy silane; monomethyl trimethoxy silane; dimethyl dimethoxy silane; monoethyl triethoxy silane; diethyl diethoxy silane; diphenyl dimethoxy silane; monomethyl triethoxy silane; monoethyl tributoxy silane; diethyl dibutoxy silane; dimethoxy dibutoxy silane; vinyl methyl dimethoxy silane; vinyl ethyl diethoxy silane; vinyl trimethoxy silane; vinyl triethoxy silane; vinyl tributoxy silane; 3-acryloxypropyl trimethoxy silane; 3-acryloxypropyl triethoxy silane; 2-methacryloxyethyl trimethoxy silane; 2-methacryloxyethyl triethoxy silane; 2-glycidyloxyethyl trimethoxy silane; 2-glycidyloxyethyl triethoxy silane; 3-glycidyloxypropyl trimethoxy silane; 3-glycidyloxypropyl triethoxy silane; and the like.

Further, the antimony compound of the present composition is an alkoxy antimony or aryloxy antimony represented by the general formula

$$Sb(OR)_m \qquad (II)$$

in which R is an alkyl group or an aryl group and m is either 3 or 5.

Antimony compounds in conforming to general formula (II), which may be called an antimony alcoholate compound, may include, for example, trimethoxy antimony; triethoxy antimony; tripropoxy antimony; tributoxy antimony; pentamethoxy antimony; pentaethoxy antimony; pentapropoxy antimony; pentabutoxy antimony; triphenoxy antimony; pentaphenoxy antimony; tritolyloxy antimony; pentatolyloxy antimony; and the like. These antimony compounds can be used either singly or in a combination of two or more, as desired.

In the preparation of the silica-based film-forming composition of the invention, the partial hydrolysis product of the alkoxy silane compound should be obtained by first dissolving the alkoxy silane compound in an organic solvent, followed by the addition of water to the organic solution of the alkoxy silane compound to effect hydrolysis thereof. The direct addition of water to the alkoxy silane compound, without dilution, should be avoided because of the rapid hydrolysis reaction which occurs under such conditions, followed a by silanol condensation reaction, lead the eventual gelation of the mixture.

Organic solvents suitable for the above mentioned purpose are exemplified by alcohols such as methyl alcohol, ethyl alcohol, propyl alcohol and butyl alcohol; beta-diketones such as acetyl acetone, ethyl acetoacetate, benzoyl acetone and diethyl malonate; ketones such as acetone, methyl ethyl ketone and methyl isobutyl ketone; and polyhydric alcohols and ethers or esters thereof such as ethylene glycol, glycerin, diethylene glycol, ethylene glycol monomethyl ether, ethylene glycol monethyl ether, ethylene glycol monobutyl ether and propylene glycol as well as alkyl esters thereof. These organic solvents can be used either singly or in a mixuure of two or more, as desired. Particularly preferable in the present composition is an alcoholic solvent, optionally, with admixture of a beta-diketone in respect of the solubility of the above mentioned antimony compound as an essential ingredient in the inventive composition.

When the alkoxy silane compound is dissolved in the above mentioned organic solvent and a controlled volume of water is added to the solution, the alkoxy silane compound is hydrolyzed to give a partial hydrolysis product thereof. It is preferable that the molecules of the thus prepared hydroxy silane compound mostly have 1 to 3 hydroxy groups per molecule. In particular, the hydroxy silane compound should have 1.5 to 3 hydroxy groups per molecule on an average.

The content of the hydroxy groups in the partial hydrolysis product of the alkoxy silane compound may be quantitatively determined, for example, by a liquid chromatographic analysis of the hydrolysis product followed by a determination of the content of the respective species of the hydroxy silane compounds from the areas of the peaks in the chromatogram.

Since any of the partial hydrolysis products produced by the alkoxy silane compounds can be used as constituents of the present composition without particular limitation, no limitations can be placed on the formulation of the hydrolysis mixture, which includes the alkoxy silane compound, an organic solvent, water and an inorganic acid as a catalyst added according to need, e.g., such as hydrochloric acid, sulfuric acid, nitric acid and the like. It is usually preferable, however, that the hydrolysis of the alkoxy silane compound be performed by adding from 1 to 3 moles or, more preferably, from 1.5 to 3 moles, of water to 1 mole of the alkoxy silane compound in the presence of the above mentioned acid catalyst. This proportion of the alkoxy silane compound to water is not very critical, however, provided that a partially hydrolyzed product of the alkoxy silane compound can be obtained.

The organic solution containing the hydroxy silane obtained by the partial hydrolysis of the alkoxy silane compound in the above described manner is then, according to need, diluted by adding an organic solvent so as to form a concentration of 1 to 20% by weight of the silica ($SiO_2$) content and filtered through a filter having a pore diameter of 0.2 to 10 microns to remove insoluble matter such as dust particles prior to use.

The above mentioned concentration of silica is an approximate value calculated in the following manner. Namely, 3 to 5 ml of the hydroxy silane-containing solution prepared in the above described manner are taken and weighed accurately in a weighing bottle and subjected to evaporation to dryness by heating at 140° C. for 3 hours. The weight of the residual solid material is then divided by the weight of the solution and recorded as the concentration of silica in percent by weight.

The other essential ingredient in the present composition is an antimony compound, i.e., alkoxy antimony or axyloxy antimony, which is added to the hydroxy silane-containing solution in an amount in the range of from 10 to 80% by weight based on the content of silica in the solution. When the content of the antimony compound is too small, the composition is not fully effective as a dopant form of antimony. On the other hand, when the content of the antimony compound is too high, the composition would be poorly storable due to decreased stability. It is optional in the preparation of the present composition that a calculated and weighed amount of the antimony compound is dissolved in advance in one of the above named organic solvents or, preferably, in an alcohol solvent or a solvent mixture mainly composed of an alcohol and this solution is subsequently added to the solution of the hydroxy silane obtained by the partial hydrolysis of the alkoxy silane compound.

It should be noted, however, that the alkoxy or aryloxy derivatives of tervalent antimony are generally poorly soluble in organic solvents. Accordingly, it is advantageous to add a dissolution agent to the solution of the solvent and the antimony compound. For example, tartaric acid can be added to the solvent in an amount in the range of from about 1 to 2 moles per mole of the antimony compound to achieve a suitable homogeneous solution. On the other hand, the alkoxy or aryloxy derivatives of pentavalent antimony have good solubility in many organic solvents, so that a solution of the antimony compound can be prepared without the addition of the dissolution agent.

As described above, the silica-based film-forming composition for diffusing the antimony is prepared by admixing the hydroxy silane-containing solution obtained by the partial hydrolysis of the alkoxy silane compound with an alkoxy or arlyoxy antimony. The thus prepared silica-based film forming cotting solution is then applied to the surface of a substrate made of a variety of semiconductor materials such as silicon wafers in the areas where the diffusion of antimony as a dopant is desired. The coated substrate is then heated to effect the therml diffusion of the antimony dopant into the substrate. The method for coating the substrate surface with the coating solution is not particularly limitative and can be any of a number of conventional coating methods, including spin coating, dip coating, spray coating, screen printing, roll coating, and brush coating methods. The substrate coated with the film-forming composition of the invention is dried at a temperature of 150° C. or higher and then heated at a temperature of 1,000° C. or higher to effect thermal diffusion of the antimony dopant. This process thus achieves an outstandingly high concentration of the dopant throughout the substrate.

If desired, the silica-based film-forming composition of the present invention may be admixed with a chlorine-containing compound in an amount not exceeding 5000 ppm (calculated as chlorine atoms) which serves as a trapping agent for any alkali metals which have detrimental effects on the performance of these semiconductor devices. The addition of the chlorine-containing compound in an excessively large concentration, however, may have a significant corrosive effect on the coating equipment.

EXAMPLES

The scope of the invention is further described in connection with the following examples which are set forth for purposes of illustration only and are not to be construed as limiting the scope of the invention in any manner.

EXAMPLE 1

A mixture comprising 76.5 g (0.37 mole) of tetraethoxy silane, 13 g (0.72 mole) of water and 140 g of n-butyl alcohol was admixed with 0.1 ml of hydrochloric acid and agitated at room temperature for 1 week to effect hydrolysis of the alkoxy silane compound so that about 50% of the tetraethoxy silane was hydrolyzed to give a solution containing the hydroxy silane in a concentration of 15% by weight as silica $SiO_2$.

Subsequently, this solution was diluted by adding n-butyl alcohol to provide a concentration of 6.2% by weight. Silica and 142.9 g of the thus diluted solution were admixed with 6.8 g of a 50% by weight solution of pentaethoxy antimony in ethyl alcohol to form an antimony-containing solution which served as the coating solution. A silicon-wafer 3 inches in diameter was coated with the coating solution on a spinner rotating at 3000 rpm for 20 seconds followed by drying at 500° C. for 10 minutes to form a coating film having a film thickness of 51 nm. The coated silicon wafer was then subjected to a heat treatment in a diffusion furnace, first at 500° C. for pre-baking to decompose and dissipate the organic matter in the coating film and then at 1230° C. for 60 minutes in a stream of a gaseous mixture of 1.5 liters/minute of nitrogen and 0.5 liter/minute of oxygen to effect a diffusion of the antimony.

After the above described diffusion treatment, the silicon water was dipped in a hydrofluoric acid of 15% by weight concentration so as to dissolve and remove the silica-based coating film for the diffusion of the antimony. The antimony-doped silicon wafer had a surface resistivity of 30.9 ohm/square. The spinner used in the above described coating works was absolutely free from rust formation, even after repeated service over a long period of time using the same coating solution.

EXAMPLE 2

A mixture comprising 112 g (0.35 mole) of tetrabutoxy silane, 11.2 g (0.62 mole) of water and 62 g of n-butyl alcohol was admixed with 0.2 ml of hydrochloric acid and agitated at room temperature for 1 week so that about 50% of the alkoxy silane compound was hydrolyzed to give a solution containing the hydroxy silane in a concentration of 15% by weight as silica.

Thereafter, this solution was diluted by adding n-butyl alcohol to provide a concentration of 6.2%. Silica and 144.2 g of the thus diluted solution were admixed with 6.8 g of a 50% by weight solution of tributoxy antimony in n-butyl alcohol to form an antimony-containing solution which served as the coating solution. A silicon wafer was coated with this coating solution and subjected to a diffusion treatment in substantially the same manner as in Example 1 to give an antimony-doped silicon wafer which had a surface resistivity of 40.9 ohm/square. The spinner used in the coating works with the above described coating solution was absolutely free from corrosion, even after repeated service for a long period of time using the same coating solution.

EXAMPLE 3

A mixture comprising 100 g (0.42 mole) of dibutoxy dimethoxy silane, 15 g (0.83 mole) of water and 100 g of ethyl alcohol was admixed with 0.1 ml of hydrochloric acid and agitated at room temperature for 1 week so that about 50% of the alkoxy silane compound was hydrolyzed to give a solution containing the hydroxy silane in a concentration of 18% as silica.

Thereafter, this solution was diluted by adding ethyl alcohol to have a concentration of 10% by weight. Silica and 71.2 g of the thus diluted solution were admixed with 9 g of acetylacetone, 6.8 g of a 50% by weight solution of tributoxy antimony in butyl alcohol and 1.7 g of tartaric acid to form an antimony-containing solution which served as the coating solution. A silicon wafer was coated with this solution and subjected to the diffusion treatment in substantially the same manner as in Example 1 to give an antimony-doped silicon wafer which had a surface resistivity of 30 ohm/square. The spinner used in the coating works with the above described coating solution was absolutely free from corrosion, even after repeated service over a long period of time using the same coating solution.

EXAMPLE 4

A mixture comprising 305 g (1.47 moles) of tetraethoxy silane, 79.5 g (4.41 moles) of water and 560 g of ethyl alcohol was admixed with 2 ml of nitric acid and agitated at room temperature for 1 week so that about 75% of the tetraethoxy silane was hydrolyzed to give a solution containing the hydroxy silane in a concentration of 12% by weight as silica.

Subsequently, this solution was diluted by adding ethyl alcohol to provide a concentration of 6.2% by weight. Silica and 135.6 g of the thus diluted solution was admixed with 12.2 g of a 50% by weight solution of pentabutoxy antimony in butyl alcohol to form an antimony-containing solution which served as the coating solution. A silicon wafer was coated with this coating solution and subjected to the diffusion treatment of antimony in substantially the same manner as in Example 1 to give an antimony-doped silicon wafer which had a surface resistivity of 25 ohm/square. The spinner used in the coating works with the above described coating solution was absolutely free from corrosion, even after repeated service for a long period of time with the same coating solution.

EXAMPLE 5

A mixture comprising 225 g (1.48 moles) of tetramethoxy silane, 53 g (2.94 moles) of water and 640 g of ethyl alcohol was agitated at room temperature for 1 week so that about 50% of the alkoxy silane compound was hydrolyzed to give a solution containing the hydroxy silane as the partial hydrolysis product of the tetramethoxy silane in a concentration of 11% by weight as silica.

Thereafter, this solution was diluted by adding ethyl alcohol to provide a concentration of the hydroxy silane of 6.2% by weight. Silica and 140 g of the thus diluted solution were admixed with 12.6 g of a 50% by weight solution of pentabutoxy antimony in butyl alcohol to form an antimony-containing solution which served as the coating solution. A silicon wafer was coated with this coating solution and then subjected to the diffusion treatment of antimony in substantially the same manner as in Example 1 to give an antimony doped silicon wafer which had a surface resistivity of 25.0 ohm/square. The spinner used in the coating works was absolutely free from corrosion even after repeated service over a long period of time using the same coating solution.

EXAMPLE 6

A mixture comprising 76.5 g (0.37 mole) of tetraethoxy silane, 9.6 g (0.53 mole) of water and 140 g of butyl alcohol was admixed with 0.1 ml of hydrochloric acid and agitated at room temperature for 1 week so that about 38% of the alkoxy silane compound was hydrolyzed to give a solution containing the hydroxy silane as the partial hydrolysis product of the tetraethoxy silane in a concentration of 15% by weight as silica.

Thereafter, this solution was diluted by adding butyl alcohol to provide a concentration of the hydroxy silane of 6.2% by weight. Silica and 168.2 g of the thus diluted solution were admixed with 10.5 g of a 50% by weight solution of tributoxy antimony in butyl alcohol to form an antimony-containing solution which served as the coating solution. A silicon wafer was coated with this coating solution and subjected to the diffusion treatment of antimony substantially in the same manner as in Example 1 to give an antimony-doped silicon wafer which had a surface resistivity of 34.0 ohm/square. The spinner used in the caating works with the above described coating solution was absolutely free from corrosion, even after repeated service over a long period of time using the same coating solution.

EXAMPLE 7

A mixture comprising 112 g (0.35 mole) of tetrabutoxy silane, 11.2 g (0.62 mole) of water and 62 g of butyl alcohol was admixed with 0.2 ml of hydrochloric acid and agitated at room temperature for 1 week so that about 50% of the alkoxy silane compound was hydrolyzed to form a solution containing the hydroxy silane as the partial hydrolysis product of the tetrabutoxy silane in a concentration of 15% by weight as silica.

Thereafter, this solution was diluted by adding butyl alcohol to provide a concentration of the hydroxy silane of 6.2%. Silica and 168.2 g of the thus diluted solution were admixed with 10.5 g of a 50% by weight solution of tributoxy antimony in butyl alcohol to form an antimony-containing solution which served as the coating solution. A silicon wafer was coated with this coating solution and then subjected to the diffusion treatment of antimony substantially in the same manner as in Example 1 to give an antimony-doped silicon wafer which had a surface resistivity of 41 ohm/square. The spinner used in the coating works with the above described coating solution was absolutely free from corrosion, even after repeated service over a long period of time using the same coating solution.

EXAMPLE 8

A mixture comprising 76.5 g (0.37 mole) of tetraethoxy silane, 20 g (1.11 moles) of water and 140 g of butyl alcohol was admixed with 0.1 ml of hydrochloric acid and agitated at room temperature for 1 week so that about 75% of the alkoxy silane compound was hydrolyzed to give a solution containing the hydroxy silane as the partial hydrolysis product of the tetraethoxy silane in a concentration of 15% by weight as silica.

Subsequently, this solution was diluted by adding butyl alcohol to provide a concentration of the hydroxy silane of 6.2% by weight. Silica and 142.9 g of the thus diluted solution were admixed with 6.8 g of a 50% by weight solution of triethoxy antimony in ethyl alcohol to give an antimony-containing solution which served as the coating solution. A silicon wafer was then coated with this coating solution and subjected to the diffusion treatment of antimony substantially in the same manner as in Example 1 to form an antimony-doped silicon wafer which had a surface resistivity of 31 ohm/square. The spinner used in the coating works with the above described coating solution was absolutely free from the problem of corrosion even after repeated service over a long period of time using the same coating solution.

EXAMPLE 9

A mixture comprising 306 g (1.47 moles) of tetraethoxy silane, 53 g (2.94 moles) of water and 560 g of ethyl alcohol was admixed with 0.4 ml of hydrochloric acid and agitated at room temperature for 1 week so that about 50% of the alkoxy silane compound was hydrolyzed to form a solution containing the hydroxy silane as the partial hydrolysis product of the tetraethoxy silane in a concentration of 12% by weight as silica.

Subsequently, this solution was diluted by adding ethyl alcohol to form a concentration of the hydroxy silane of 8.7% by weight. Silica and 150 g of the thus diluted solution were admixed with 20 g of a 50% by weight solution of triphenoxy antimony in ethyl alcohol to give an antimony-containing solution which served as the coating solution. A silicon wafer was then coated with this coating solution and subjected to the diffusion treatment of antimony substantially in the same manner as in Example 1 to give an antimony-doped silicon wafer which had a surface resistivity of 45 ohms/square. The spinner used in the coating works with the above described coating solution was absolutely free from corrosion, even after repeated service over a long period of time using the same coating solution.

EXAMPLE 10

A mixture comprising 225 g (1.48 moles) of tetramethoxy silane, 40 g (2.22 moles) of water and 640 g of butyl alcohol was admixed with 2 ml of nitric acid and agitated at room temperature for 1 week so that about 38% of the alkoxy silane compound was hydrolyzed to form a solution containing the hydroxy silane as the partial hydrolysis product of the tetramethoxy silane in a concentration of 13% by weight as silica.

Thereafter, this solution was diluted by adding butyl alcohol to form a concentration of the hydroxy silane of 8.7% by weight. Silica and 156 g of a 50% by weight solution of pentaphenoxy antimony in n-butyl alcohol were mixed to form an antimony-containing solution which served as the coating solution. A silicon wafer was coated with this coating solution and subjected to the diffusion treatment of antimony substantially in the same manner as in Example 1 to give an antimony-doped silicon wafer which had a surface resistivity of 45 ohm/ square. The spinner used in the coating works with the above described coating solution was absolutely free from corrosion even after repeated service over a long period of time using the same coating solution.

EXAMPLE 11

A mixture comprising 200 g (0.76 mole) of tetrapropoxy silane, 27 g (1.56 moles) of water and 200 g of n-propyl alcohol was admixed with 0.1 ml of sulfuric acid and agitated at room temperature for 1 week so that about 50% of the alkoxy silane compound was hydrolyzed to form a solution containing the hydroxy silane as the partial hydrolysis product of the tetrapropoxy silane in a concentration of 14% by weight as silica.

Subsequently, this solution was diluted by adding n-propyl alcohol to have a concentration of the hydroxy silane of 7.0% by weight. Silica and 100 g of the thus diluted solution were admixed with 10 g of a 50% by weight solution of triphenoxy antimony in n-propyl alcohol to form an antimony-containing mixture which served as the coating solution. A silicon wafer was then coated with this solution and subjected to the diffusion treatment of antimony substantially in the same manner as in Example 1 to give an antimony-doped silicon wafer which had a surface resistivity of 35 ohm/square. The spinner used in the coating works with the above described coating solution was absolutely free from corrosion even after repeated service over a long period of time using the same coating solution.

EXAMPLE 12

A mixture comprssing 112 g (0.35 mole) of tetrabutoxy silane, 11.2 g (0.62 mole) of water and 62 g of ethylene glycol monobutyl ether was admixed with 2 ml of nitric acid and agitated at room temperature for 1 week so that about 50% of the alkoxy silane compound was hydrolyzed to form a solution containing the hydroxy silane as the partial hydrolysis product of the tetrabutoxy silane in a concentration of 15% by weight as silica.

Thereafter, this solution was diluted by adding ethylene gglycol monobutyl ether to form a concentration of the hydroxy silane of 5 by weight as silica. 120 g of the thus diluted solution were admixed with 6 g of a 50% by weight solution of triphenoxy antimony in n-propyl alcohol to give an antimony-containing solution which served as the coating solution. A silicon wafer was coated with this coating solution and then subjected to the diffusion treatment of antimony substantially in the same manner as in Example 1 to give an antimony-doped silicon wafer which had a surface resistivity of 32 ohm/square. The spinner used in the coating works with the above described coating solution was absolutely free from corrosion even after repeated service over a long period of time using the same coating solution.

EXAMPLE 13

A mixture comprising 112 g (0.35 mole) of tetrabutoxy silane, 11.2 g (0.62 mole) of water and 62 g of butyl alcohol was admixed with 0.2 ml of hydrochloric acid and agitated at room temperature for 1 week so that about 50% of the alkoxy silane compound was hydrolyzed to form a solution containing the hydroxy silane as the partial hydrolysis product of the tetrabutoxy silane in a concentration of 15% by weight as silica.

Subsequently, this solution was diluted by adding butyl alcohol to form a concentration of the hydroxy silane of 6.2% by weight. 144.2 g of the thus diluted solution were admixed with 6.8 g of a 50% by weight solution of triethoxy antimony in ethyl alcohol to form an antimony-containing solution which served as the coating solution. A silicon wafer was coated with this coating solution and subjected to the diffusion treatment of antimony substantially in the same manner as in Example 1 to give an antimony-doped silicon wafer which had a surface resistivity of 41 ohm/square. The spinner used in the coating works with the above described coating solution was absolutely free from corrosion even after repeated service over a long period of time using the same coating solution.

EXAMPLE 14 (Comparative)

The hydroxy silane-containing solution obtained in Example 1 by the partial hydrolysis of tetraethoxy silane in butyl alcohol was diluted by adding butyl alcohol to form a concentration of the hydroxy silane of 6.2% by weight as silica. 168 g of the thus diluted solution wer admixed with 10.5 g of a 50% by weight solution of antimony chloride in ethyl alcohol to give an antimony-containing solution which served as the coating solution. A silicon wafer was coated with this coating solution and subjected to the diffusion treatment of antimony substantially in the same manner as in Example 1 to give an antimony-doped silicon wafer which had a surface resistivity of 43.2 ohm/square. Corrosion of the spinner used in the coating works with the above described coating solution was found on surfaces contacting the coating solution after repeated service for a certain length of time using the same coating solution.

While it is apparent that the invention herein disclosed is well calculated to fulfill the objects above stated, it will be appreciated that numerous modifications and embodimens may be devised by those skilled in the art, and it is intended that the appended claims cover all such modifications and embodiments as fall within the true spirit and scope of the present invention.

What is claimed is:

1. A silica-based film-forming composition for diffusion of antimony which comprises:
   an organic solvent;
   a partial hydrolysis product of an alkoxy silane compound dissolved in the organic solvent wherein said alkoxy silane compound is represented by the general formula $(R^1O)_{4-n}SiR^2{}_n$ in which $R^1$ and $R^2$ are, each independently from the other, an alkyl, alkoxy, alkenyl, aryl, glycidyloxy alkyl, acryloxy alkyl, or methacryloxy alkyl group and n is 0, 1, 2 or 3; and an antimony compound represented by the general formula $Sb(OR)_m$ in which R is an alkyl group or an aryl group and m is a positive integer of 3 or 5 dissolved in the organic solvent.

2. The composition of claim 1 wherein the silane is present in an amount of between about 1 and 20 weight percent while the antimony compound is present in an amount of between about 10 and 80 weight percent, said percent calculated on the basis of the silica content of the composition.

3. The composition of claim 1 wherein the alkoxy silane compound is represented by the general formula $$(R^1O)_{4-n}SiR^2_n$$

in which $R^1$ and $R^2$ are, each independently from the other, an alkyl, alkoxy, alkenyl, aryl, glycidyloxy alkyl, acryloxy alkyl, or methacryloxy alkyl group and n is zero, 1, 2 or 3.

4. The composition of claim 1 wherein the alkoxy silane compound is a tetraalkoxy silane.

5. The composition of claim 1 wherein m is equal to 3 and further comprising a dissolution agent in an amount sufficient to form a homogeneous solution of the antimony compound in the solvent.

6. The composition of claim 1 wherein the organic solvent is an alcohol, beta-diketone, ketone polyhydric alcohol or ethers or esters thereof.

7. The composition of claim 1 wherein the organic solvent is an alcohol.

8. A silica-based film-forming composition for diffusion of antimony which comprises:
an organic solvent;
a partial hydrolysis product of an alkoxy silane compound in an amount between about 1 and 20 weight percent calculated as the silica content of the composition wherein said alkoxy silane compound is represented by the general formula $$(R^1O)_{4-n}SiR^2_n$$

in which $R^1$ and $R^2$ are, each independently from the other, an alkyl, alkoxy, alkenyl, aryl, glycidyloxy alkyl, acryloxy alkyl or methacryloxy alkyl group and n is 0, 1, 2 or 3; and an alkoxy antimony or aryloxy antimony compound represented by the general formula $Sb(OR)_m$ in which R is an alkyl group or an aryl group and m is a positive integer of 3 or 5, wherein said antimony compound is added in an amount of between about 10 and 80 weight percent based on the silica content of the composition.

9. The composition of claim 8 wherein the solvent is at least one of an alcohol, beta-diketone, ketone, polyhydric alcohol, or ethers or esters thereof.

10. The composition of claim 8 wherein the silane compound has between 1 and 3 hydroxy groups per molecule.

11. The composition of claim 8 wherein the alkoxy silane compound is represented by the general formula $$(R^1O)_{4-n}SiR^2_n$$

in which $R^1$ and $R^2$ are, each independently from the other, an alkyl, alkoxy, alkenyl, aryl, glycidyloxy alkyl, acryloxy alkyl, or methacryloxy alkyl group and n is zero, 1, 2 or 3.

12. The composition of claim 8 wherein the alkoxy silane compound is a tetraalkoxy silane.

13. The composition of claim 1 further comprising a chlorine-containing compound in an amount sufficient to serve as a trapping agent for the removal of alkali metals, but not exceeding 5,000 ppm.

14. The composition of claim 13 wherein the antimony compound is trimethoxy antimony, triethoxy antimony, trimethoxy antimony; triethoxy antimony; tripropoxy antimony; tributoxy antimony; pentamethoxy antimony; pentaethoxy antimony; pentapropoxy antimony; pentabutoxy antimony; triphenoxy antimony; pentaphenoxy antimony; tritolyloxy antimony; pentatolyloxy antimony; or mixtures thereof.

15. A silica-based film forming composition for diffusion of antimony comprising:
an organic solvent of an alcohol, beta diketone, ketone, polyhydric alcohol, or ethers or esters thereof;
a partial hydrolysis product of an alkoxy silane represented by the general formula $(R^1O)_{4-n}SiR^2_n$ in which $R^1$ and $R^2$ are, each independently from the other, an alkyl, alkoxy, alkenyl, aryl, glycidyloxy alkyl, acryloxy alkyl, or methacryloxy alkyl group and n is zero, 1, 2 or 3, and an antimony compound represented by the general formula $Sb(OR)_m$ in which R is an alkyl group or an aryl group and m is a positive integer of 3 or 5.

16. The composition of claim 15 wherein the alkoxy silane is present in an amount of between 1 and 20 weight percent while the antimony compound is present in an amount of between 10 and 80 weight percent, said percents calculated on the basis of silica content of the composition.

17. The composition of claim 15 wherein the alkoxy silane compound is a tetraalkoxy silane.

18. The composition of claim 16 wherein the alkoxy silane compound is a tetraalkoxy silane.

19. The composition of claim 15 wherein the organic solvent is an alcohol.

20. The composition of claim 19 wherein the alcohol is butyl alcohol.

21. The composition of claim 1 wherein m is equal to 5.

22. The composition of claim 8 wherein m is equal to 5.

23. The composition of claim 15 wherein m is equal to 5.

24. The composition of claim 1 wherein said alkoxy silane compound is tetramethoxy silane; tetraethoxy silane; tetrapropoxy silane; tetrabutoxy silane; monomethyl trimethoxy silane; dimethyl dimethoxy silane; monoethyl triethoxy silane; diethyl diethoxy silane; diphenyl dimethoxy silane; monomethyl triethoxy silane; monoethyl tributoxy silane; diethyl dibutoxy silane; dimethoxy dibutoxy silane; vinyl methyl dimethoxy silane; vinyl ethyl diethoxy silane; vinyl trimethoxy silane; vinyl triethoxy silane; vinyl tributoxy silane; 3-acryloxypropyl trimethoxy silane; 3-acryloxypropyl triethoxy silane; 2-methacryloxethyl trimethoxy silane; 2-methacryloxyethyl triethoxy silane; 2-glycidyloxyethyl trimethoxy silane; 2-glycidyloxyethyl triethoxy silane; 3-glycidyloxypropyl trimethoxy silane or 3-glycidyloxypropyl triethoxy silane.

25. The composition of claim 1 wherein said antimony compound is trimethoxy antimony; triethoxy antimony; tripropoxy antimony; tributoxy antimony; pentamethoxy antimony; pentaethoxy antimony; pentapropoxy antimony; pentabutoxy antimony; triphenoxy antimony; pentaphenoxy antimony; tritolyloxy antimony; pentatolyloxy antimony; or mixtures thereof.

26. The composition of claim 8 wherein said alkoxy silane compound is tetramethoxy silane; tetraethoxy silane; tetrapropoxy silane; tetrabutoxy silane; monomethyl trimethoxy silane; dimethyl dimethoxy silane; monoethyl triethoxy silane; diethyl diethoxy silane; diphenyl dimethoxy silane; monomethyl triethoxy silane; monoethyl tributoxy silane; diethyl dibutoxy silane; dimethoxy dibutoxy silane; vinyl methyl dimethoxy silane; vinyl ethyl diethoxy silane; vinyl trimethoxy silane; vinyl triethoxy silane; vinyl tributoxy silane; 3-acryloxypropyl trimethoxy silane; 3-acryloxypropyl triethoxy silane; 2-methacryloxethyl trimethoxy silane; 2-methacryloxyethyl triethoxy silane; 2-glycidyloxyethyl trimethoxy silane; 2-glycidyloxyethyl triethoxy silane; 3-glycidyloxypropyl trimethoxy silane or 3-glycidyloxypropyl triethoxy silane.

27. The composition of claim 15 wherein said alkoxy silane compound is tetramethoxy silane; tetraethoxy silane; tetrapropoxy silane; tetrabutoxy silane; monomethyl trimethoxy silane; dimethyl dimethoxy silane; monoethyl triethoxy silane; diethyl diethoxy silane; diphenyl dimethoxy silane; monomethyl triethoxy silane; monoethyl tributoxy silane; diethyl dibutoxy silane; dimethoxy dibutoxy silane; vinyl methyl dimethoxy silane; vinyl ethyl diethoxy silane; vinyl trimethoxy silane; vinyl triethoxy silane; vinyl tributoxy silane; 3-acryloxypropyl trimethoxy silane; 3-acryloxypropyl triethoxy silane; 2-methacryloxyethyl triemthoxy silane; 2-methacryloxyethyl triethoxy silane; 2-glycidyloxyethyl trimethoxy silane; 2-glycidyloxyethyl triethoxy silane; 3-glycidyloxypropyl trimethoxy silane or 3-glycidyloxypropyl triethoxy silane.

28. The composition of claim 15 wherein said antimony compound is trimethoxy antimony; triethoxy antimony; tripropoxy antimony; tributoxy antimony; pentamethoxy antimony; pentaethoxy antimony; pentapropoxy antimony; pentabutoxy antimony; triphenoxy antimony; pentaphenoxy antimony; tritolyloxy antimony; pentatolyloxy antimony; or mixtures thereof.

29. The composition of claim 15 further comprising a chlorine-containing compound in an amount sufficient to serve as a trapping agent for the removal of alkali metals but not exceeding 5,000 ppm.

30. The composition of claim 8 wherein m is equal to 3 and further comprising a dissolution agent in an amount sufficient to form a homogeneous solution of the antimony compound in the solvent.

31. The composition of claim 15 wherein m is equal to 3 and further comprising a dissolution agent in an amount sufficient to form a homogeneous solution of the antimony compound in the solvent.

32. The composition of claim 8 further comprising a chlorine-containing compound in an amount sufficient to serve as a trapping agent for the removal of alkali metals, but not exceeding 5,000 ppm.

* * * * *